United States Patent
Lamrani et al.

(10) Patent No.: US 7,951,659 B2
(45) Date of Patent: May 31, 2011

(54) METHOD FOR SIMULTANEOUSLY TENSILE AND COMPRESSIVE STRAINING THE CHANNELS OF NMOS AND PMOS TRANSISTORS RESPECTIVELY

(75) Inventors: Younes Lamrani, Bourg-En-Bresse (FR); Jean-Charles Barbe, Grenoble (FR); Marek Kostrzewa, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 107 days.

(21) Appl. No.: 12/505,161

(22) Filed: Jul. 17, 2009

(65) Prior Publication Data
US 2010/0041205 A1 Feb. 18, 2010

(30) Foreign Application Priority Data

Jul. 21, 2008 (FR) .................................... 08 54946

(51) Int. Cl.
*H01L 21/00* (2006.01)
*H01L 21/84* (2006.01)
*H01L 21/337* (2006.01)
*H01L 21/76* (2006.01)
*H01L 21/20* (2006.01)
*H01L 21/36* (2006.01)

(52) U.S. Cl. ........ 438/164; 438/196; 438/412; 438/489; 257/E21.546

(58) Field of Classification Search .................. 438/164, 438/196, 412, 424, 489, 478; 257/E21.546
See application file for complete search history.

(56) References Cited

U.S. PATENT DOCUMENTS

| 6,764,908 | B1 | 7/2004 | Kadosh et al. |
| 7,091,095 | B2 | 8/2006 | Chu |
| 7,223,994 | B2 | 5/2007 | Chidambarrao et al. |
| 7,262,087 | B2 | 8/2007 | Chidambarrao et al. |
| 2004/0132267 | A1 | 7/2004 | Sadana et al. |
| 2005/0082531 | A1 | 4/2005 | Rim |
| 2006/0091105 | A1 | 5/2006 | Barbe et al. |
| 2006/0214232 | A1 | 9/2006 | Chen et al. |
| 2007/0254423 | A1 | 11/2007 | Chidambarrao et al. |

OTHER PUBLICATIONS

U.S. Appl. No. 12/520,385, filed Jun. 19, 2009, Barbe, et al.
Chen-Yu Hsieh, et al., "Measurement of Channel Stress Using Gate Direct Tunneling Current in Uniaxially Stressed nMOSFETs", IEEE Electron Device Letters, vol. 28, No. 9, XP011190974, Sep. 2007, pp. 818-820.
S. M. Hu, "Stress-related problems in silicon technology", Journal of Applied Physics 70 (6), Sep. 15, 1991, pp. R53-R80.
S. M. Hu, "Film-edge-induced stress in substrates", Journal of Applied Physics 50 (7), Jul. 1979, pp. 4661-4666.

*Primary Examiner* — Alexander G Ghyka
*Assistant Examiner* — Seahvosh J Nikmanesh
(74) *Attorney, Agent, or Firm* — Oblon, Spivak, McClelland, Maier & Neustadt, L.L.P.

(57) ABSTRACT

A method of forming a microelectronic device comprising, on a same support: at least one semi-conductor zone strained according to a first strain, and at least one semi-conductor zone strained according to a second strain, different to the first strain, comprising: the formation of semi-conductor zones above a pre-strained layer, then trenches extending through the thickness of the pre-strained layer, the dimensions and the layout of the semi-conductor zones as a function of the layout and the dimensions of the trenches being so as to obtain semi-conductor zones having a strain of the same type as that of the pre-strained layer and semi-conductor zones having a strain of a different type to that of the pre-strained layer.

25 Claims, 9 Drawing Sheets

METHOD FOR SIMULTANEOUSLY TENSILE AND COMPRESSIVE STRAINING THE CHANNELS OF NMOS AND PMOS TRANSISTORS RESPECTIVELY

CROSS-REFERENCE TO RELATED APPLICATION

The present application claims benefit of priority under 35 U.S.C. §119 to French patent application No. 08 54946, filed in the French patent office on Jul. 21, 2008, the entire content of which is incorporated herein by reference.

TECHNICAL FIELD

The present invention relates to the field of integrated circuits, and more specifically to that of transistors, and has the aim of proposing a method of forming a microelectronic device provided with several transistors with improved electrical performance, and in particular wherein, on a same substrate, one or several transistors are tensile strained whereas one or several other transistors are compressive strained.

STATE OF THE PRIOR ART

In the MOS (Metal Oxide Semiconductor) transistor, two charge carrier reservoirs: the source and the drain, are separated by a potential barrier formed by the channel. This barrier is controlled by a gate of a length that can vary from several nanometers to several tens of nanometers. The gate is separated from the channel by a gate dielectric.

Reducing the dimension of transistors is a constant aim. In existing methods of forming microelectronic devices, the implementation of a strained silicon layer on a SOI (Silicon on Insulator) substrate, has made it possible to increase both the mobility of the carriers thanks to the effect of a mechanical strain on a semi-conductor material and the integration density thanks to an electrical insulation of the transistor. The introduction of mechanical strains in the conduction channel makes it possible to improve very considerably the mobility of the carriers, and thus the electrical performance of the transistors.

A biaxial tensile mechanical strain can make it possible to increase in a significant manner the mobility of electrons for NMOS transistors.

For PMOS transistors, a compressive strain makes it possible for its part to obtain a gain in mobility of holes.

At present, different methods exist to enable a transistor channel to be strained. A standard substrate with a channel strained during the manufacture of the transistor may be used. A modified pre-strained substrate on which a channel zone is formed may also be used.

In order to improve the mobility of the charge carriers both in NMOS and PMOS transistors, methods that make it possible to form, on a same substrate, one or several tensile strained semi-conductor zones and one or several compressive strained semi-conductor zones have appeared.

Document U.S. Pat. No. 7,262,087 B2 discloses a method of forming a microelectronic device, wherein NFET regions are tensile strained whereas PFET regions are compressive strained. The microelectronic device is formed from a substrate on which is formed a first stack comprising a first layer of compressive strained dielectric material, on which is formed a first layer of semi-conductor material placed on the first layer of dielectric material. The first layer of dielectric material makes it possible to induce a tensile strain on the first layer of semi-conductor material.

Beside this first stack, a second stack is formed. This second stack is formed of a second layer of tensile strained dielectric material formed on the substrate and a second layer of semi-conductor material placed on the layer of tensile strained dielectric material. The second dielectric layer transfers compressive strains to the second layer of semi-conductor material. Such a method requires the formation of a buried tensile strained dielectric zone and a buried compressive strained dielectric zone.

Document U.S. Pat. No. 7,223,994 B2 discloses, for its part, a method wherein is grown, on a substrate, a compressive strained layer of SiGe or Si:C on which a layer of semi-conductor material is deposited. After an etching step that makes it possible to define an island comprising a tensile strained semi-conductor pattern, another layer based on SiGe is deposited, this time tensile strained, then a layer of semi-conductor material is deposited. An etching step enables another semi-conductor island, compressive strained, to be defined.

Document U.S. Pat. No. 7,091,095 B2, discloses, for its part, a formation of a device comprising patterns of semi-conductor material in which the conduction of electrons is promoted and patterns of semi-conductor material in which the conduction of holes is also promoted. Such a formation method comprises the growth, side by side, of a zone based on tensile strained SiGe and another zone based on compressive strained SiGe.

Such a method is complex and long to implement in so far as it requires several different successive epitaxy steps.

The problem is posed of finding a novel method of forming a microelectronic device comprising one or several tensile strained semi-conductor zones and one or several compressive strained semi-conductor zones, which does not comprise the aforementioned drawbacks.

DESCRIPTION OF THE INVENTION

The invention relates, in particular, to a method of forming a microelectronic device comprising one or several tensile strained semi-conductor zones and one or several compressive strained semi-conductor zones, which does not comprise the aforementioned drawbacks, wherein trenches are formed in a pre-strained layer above which semi-conductor zones have been formed beforehand, the dimensions and the layout of the trenches in relation to the semi-conductor zones, as well as the critical dimension of the semi-conductor zones being provided so as to form at least one compressive strained semi-conductor zone and at least one tensile strained semi-conductor zone.

According to a first aspect, the invention relates to a method of forming a microelectronic device comprising, on a same support: at least one tensile strained semi-conductor zone, and at least one compressive strained semi-conductor zone.

This method comprises steps consisting in:

a) forming from a stack of layers resting on a substrate and comprising at least one semi-conductor layer situated above at least one pre-strained layer, at least one first semi-conductor zone having a first critical dimension $L_8$ chosen less than a predetermined length Lc, and at least one second semi-conductor zone having a second critical dimension $L_9$ chosen greater than said predetermined length Lc, b) forming one or several trenches in at least a part of the thickness of said pre-strained layer, at least one first trench among said trenches being situated in the continuation of at least one first side of said first semi-conductor zone, the limit length Lc having been determined at least as a function of the thickness of the layers of the stack in which the trenches are formed.

The first semi-conductor zone has, following step b), a strain of the same type as said pre-strained layer, for example a tensile strain, whereas said second semi-conductor zone has a strain of an opposite type to that of said pre-strained layer, for example a compressive strain.

According to another aspect, the invention relates to a method of forming a microelectronic device comprising on a same support: at least one tensile strained semi-conductor zone, and at least one compressive strained semi-conductor zone, the method comprising the steps consisting in:

a) forming from a stack of layers resting on a substrate and comprising at least one semi-conductor layer situated above at least one pre-strained layer, at least one first semi-conductor zone having a first critical dimension $L_8$ provided less than a predetermined length Lc, b) forming one or several trenches in at least a part of the thickness of said pre-strained layer, at least one first trench among said trenches being situated in the continuation of at least one first side of said first semi-conductor zone, a space d, such that d>Lc/2 is provided between said second semi-conductor zone and said trenches, the limit length Lc having been determined as a function of the thickness of the layers of the stack in which the trenches have been formed.

The first semi-conductor zone has, following step b), a strain of the same type as said pre-strained layer, said second semi-conductor zone having a strain of a type opposite to that of said pre-strained layer.

According to this other aspect, the second semi-conductor zone may if necessary have a critical dimension less than or equal to the limit length Lc. By virtue of the space d provided between the trenches and the second semi-conductor zone, the type of strain to which the second semi-conductor zone is subjected is different to that to which the first semi-conductor zone is subjected.

The depth of the trenches may be provided at around the half-length of the semi-conductor zone.

The depth of the trenches may be provided less than the critical dimension of said second semi-conductor zone.

Among said trenches at least one other trench may be formed in the continuation of a second side of said first semi-conductor zone, opposite to said first side.

According to one possibility, the second semi-conductor zone and the first semi-conductor zone may rest on a same block etched at step b) in said stack, with at least two of said trenches situated on either side of said same etched block.

According to one possibility, said trenches may be formed in a part of the thickness of the pre-strained layer.

According to an alternative, said trenches may be formed in the entire thickness of the pre-strained layer.

The depth of the trenches may be provided as a function of the level of strain that it is wished to apply to the first semi-conductor zone and to the second semi-conductor zone.

Said pre-strained layer may be a biaxial strain in a plane orthogonal to the principal plane of the substrate.

According to one possibility, said pre-strained layer may be based on a dielectric material such as $Si_3N_4$.

Said stack may comprise an adhesion layer between the pre-strained layer and the semi-conductor layer.

According to one specific embodiment, said semi-conductor layer may be pre-strained or have an intrinsic strain.

Said pre-strained layer may be situated on a layer of dielectric material resting on a semi-conductor support layer.

The method may further comprise: the filling of the trenches by means of an insulating material.

The method may also comprise: the formation on one or several or on all of said semi-conductor zones at least one gate dielectric zone and at least one gate on the gate dielectric zone.

Thus, MOS transistors may be formed on the first semi-conductor zone and on the second semi-conductor zone.

Said layer of dielectric material may be a tensile pre-strained layer, following step b), said first semi-conductor zone being a tensile strained layer, said second semi-conductor zone being compressive strained.

BRIEF DESCRIPTION OF DRAWINGS

The present invention will be better understood on reading the description of embodiments, given purely by way of indication and in no way limiting, and by referring to the appended figures in which.

Identical, similar or equivalent parts of the different figures described hereafter bear the same number references so as to make it easier to go from one figure to the next.

Figure 1A:
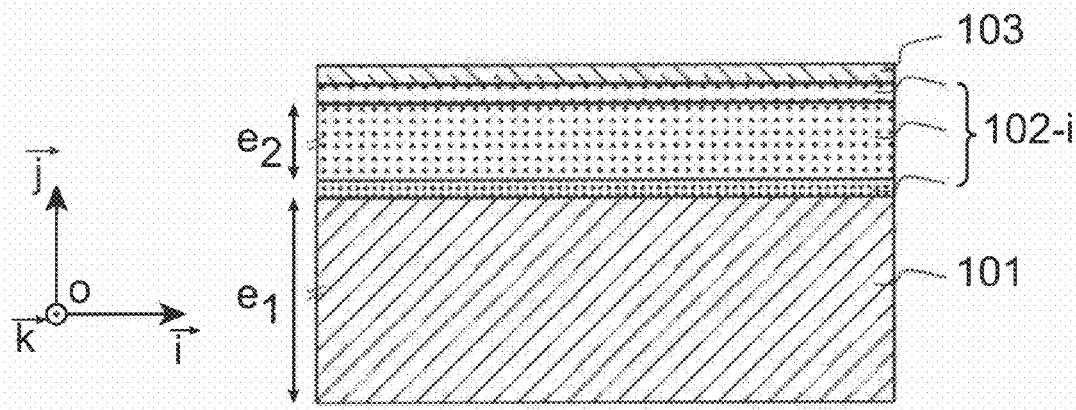
FIGS. 1A-1C, illustrate an example of method according to the invention, of forming a microelectronic device provided with semi-conductor zones undergoing different strains on a same substrate.
Figure 1B:
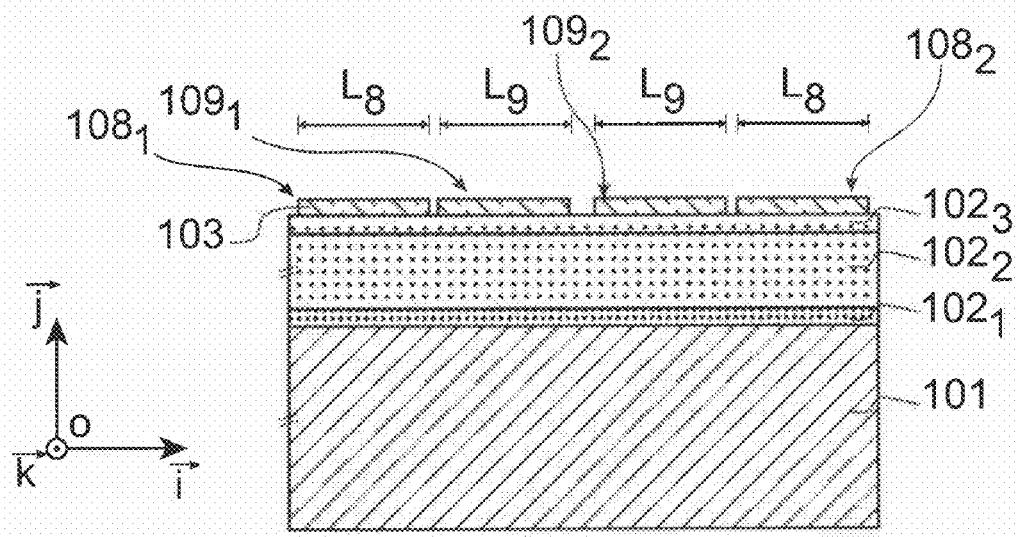

In order to make the figures easier to read, the different parts represented in the figures are not necessarily to the same scale.

DETAILED DESCRIPTION OF SPECIFIC EMBODIMENTS

An example of method according to the invention, of forming a microelectronic device comprising at least one tensile strained semi-conductor zone and at least one other compressive strained semi-conductor zone, will now be given, with reference to FIGS. 1A-1C and 2.

The starting material or component of the method (FIG. 1A) may be a substrate formed of a first layer 101 of semi-conductor material, for example based on Si.

The first layer 101 is provided to serve as mechanical support and has a thickness $e_1$, preferably very large compared to the thickness of all the other layers of the device. The layer 101 may have a thickness for example of around ten or so micrometers or several tens of micrometers.

Above the support layer 101, there is at least one layer known as "pre-strained". This "pre-strained" layer may have an intrinsic strain that may be biaxial in a plane perpendicular to the surface of the first layer 101.

The pre-strained layer may be formed for example by CVD (Chemical Vapour Deposition) or LPCVD (Low Pressure Chemical Vapour Deposition). The pre-strained layer may for example be based on a semi-conductor material such as SiGe.

According to another possibility, the pre-strained layer may be based on a dielectric material such as $Si_xN_y$ or $Al_2O_3$.

In one case where the pre-strained layer is based on $Si_xN_y$, the strain may be adjusted as a function of the proportion of Si. The strain exerted by the pre-strained layer may be at least 100 MPa, for example around 1 GPa.

An insulating layer 102 may be formed on the first support layer 101 based on semi-conductor material. The insulating layer 102 may be formed of several layers, of which said pre-strained layer.

The insulating layer 102 may be formed of a first layer 102$_1$ based on dielectric material, for example $SiO_2$, resting on the first layer 101 of semi-conductor material. The first layer 102$_1$ based on dielectric material may have a thickness for example of around several nanometers, for example around 10 nanometers.

The first layer 102$_1$ may be provided based on a dielectric material to promote the adhesion of a stack of layers on the first layer 101 of semi-conductor material. The first layer 102$_1$ based on dielectric material such as $SiO_2$ may thus serve as adhesion or mechanical strength layer, and may serve to bond the pre-strained layer 102$_2$, for example based on $Si_3N_4$, to the semi-conductor support layer 101.

The insulating layer 102 may also be formed of a second layer 102$_2$ based on dielectric material, for example $Si_3N_4$, resting on the first layer 101 of semi-conductor material. The second layer 102$_2$ based on dielectric material, may be said pre-strained layer. The strain in the second layer 102$_2$ of dielectric material is an intrinsic strain, which may be biaxial in a plane perpendicular to the principal plane of the substrate (the principal plane of the substrate being defined throughout the description and in FIG. 1A, by a plane parallel to the plane $[O;\vec{i};\vec{k}]$ of an orthogonal mark $[O;\vec{i};\vec{j};\vec{k}]$). The layer of pre-strained dielectric material 102$_2$ is subjected to a strain of a given type, for example a tensile strain. The strain to which the layer of dielectric material 102$_2$ is subjected may be for example around 1.5 GPa.

The insulating layer 102 may also comprise a third layer 102$_3$ based on dielectric material, for example $SiO_2$, resting on the first layer 101 of semi-conductor material. The third layer 102$_3$ may be chosen for its electrical insulation properties and have a thickness for example around ten or so nanometers, for example around 16 nanometers.

The thickness $e_2$ of the second layer of pre-strained dielectric material 102$_2$ is provided preferably greater than the thickness of the first and third layers 102$_1$ and 102$_3$ of dielectric material. The second layer of dielectric material 102$_2$ may have a thickness $e_2$ at least 10 times greater than that of the first and third layers 102$_1$ and 102$_3$ of dielectric material. The pre-strained layer 102$_2$ may have a thickness ranging for example between 50 nanometers and 200 nanometers, for example around 120 nanometers.

On the insulating layer 102 rests a thin semi-conductor layer 103, for example around 10 nanometers thick in which several active zones are intended to be formed. The pre-strained layer 102$_2$ may have a thickness provided 5 to 10 times the thickness of said thin semi-conductor layer 103.

An SOIM (Silicon on Insulating Multiple layer) type substrate comprising several dielectric layers between a semi-conductor support layer and a semi-conductor layer in which active zones are intended to be formed, may thus be formed (FIG. 1A).

The thickness of the support layer 101 is provided so as to assure a sufficient mechanical stiffness to limit the relaxation of the pre-strained layer 102$_2$ by a route other than etching.

In order to maintain a high strain state, the thickness $e_2$ of the pre-strained layer 102$_2$ is preferably low compared to the thickness $e_1$ of the layer 101 of the substrate, for example at least 20 times less than the thickness of the layer 101 of the substrate.

Then (FIG. 1B), an etching of the semi-conductor layer 103 is carried out in order to form several semi-conductor islands or semi-conductor zones 108$_1$, 108$_2$, 109$_1$, 109$_2$, disjointed from the semi-conductor layer 103. The semi-conductor zones 108$_1$, 108$_2$, 109$_1$, 109$_2$, are intended to form the active zones of transistors. Among the semi-conductor zones 108$_1$, 108$_2$, 109$_1$, 109$_2$, formed, there is a first zone 108$_1$, and a second zone 108$_2$, formed with a first critical dimension $L_8$, as well as a third zone 109$_1$, and a fourth zone 109$_2$, formed with a second critical dimension $L_9$, different to the first critical dimension $L_8$.

The first critical dimension $L_8$, is chosen less than a distance known as predetermined "limit length" Lc.

The first critical dimension $L_8$ is for example between one or several tens of nanometers and ten or so times the thickness of the semi-conductor layer 103. The first critical dimension $L_8$ may for example range between 40 and 200 nanometers and for example be around 70 nanometers.

In this embodiment, the second critical dimension $L_9$, is chosen for its part greater than the predetermined limit length Lc.

The second critical dimension $L_9$ may for example range between ten or so times the thickness of the semi-conductor layer 103 and several tens of times the thickness $e_2$ of the pre-strained layer 102$_2$. The second critical dimension $L_9$ may for example range between 50 and 300 nanometers and be for example around 100 nanometers Throughout the present description, "critical dimension" will designate the smallest dimension formed in a thin film or in a stack of thin films, apart from the thickness of this thin film or this stack of thin films.

The third semi-conductor zone 109$_1$ and the fourth semi-conductor zone 109$_2$ are spaced apart by a distance that may range for example between several nanometers and several hundreds of nanometers.

The etching of the layer 103 may be carried out by selective etching, for example silicon compared to $SiO_2$.

Then (FIG. 1C), an etching of the pre-strained layer 102$_2$ is carried out, perpendicularly to its surface. In particular, trenches 110, 120, 130, 140, are formed in the insulating layer 102. The trenches 110, 120, 130, 140 are vertical trenches, orthogonal to the principal plane of the substrate and to that of the pre-strained layer 102$_2$.

By forming these trenches 110, 120, 130, 140 blocks $B_1$, $B_2$, $B_3$ are defined. The trenches 110, 120, 130, 140, extend through the first layer of dielectric material 102$_1$, as well as at least a part of the thickness of the pre-strained layer 102$_2$, if necessary over the entire thickness of this pre-strained layer 102$_2$.

The trenches 110, 120, 130, 140, may be formed by means of one or several steps of anisotropic etchings. In this embodiment, trenches 110, 120, 130, 140, are formed on either side of each of the semi-conductor zones 108$_1$ and 108$_2$ of critical dimension $L_8$. The trenches 110, 120, 130, 140, are in particular formed in the continuation of sides of the semi-conductor zones $108_1$ and $108_2$ having the first critical dimension $L_8$.

The formation of trenches makes it possible to relax 110, 120, 130, 140, the pre-strained layer $102_2$ at its upper surface.

Figure 1C:
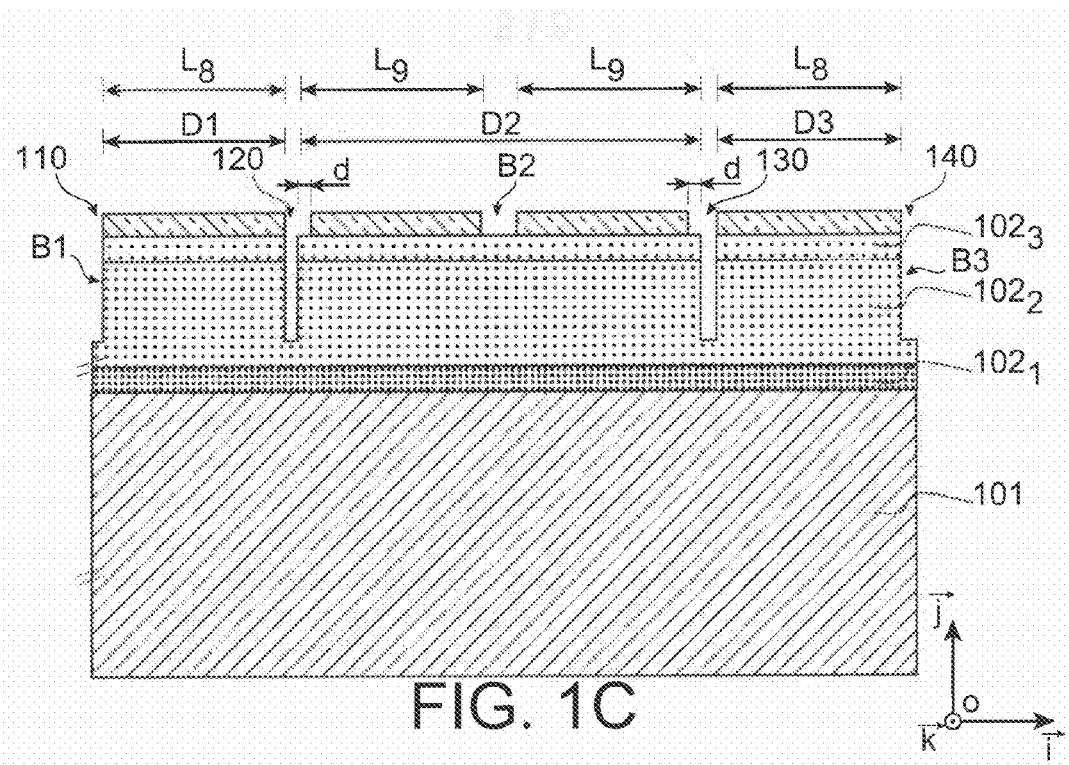
Figure 2:
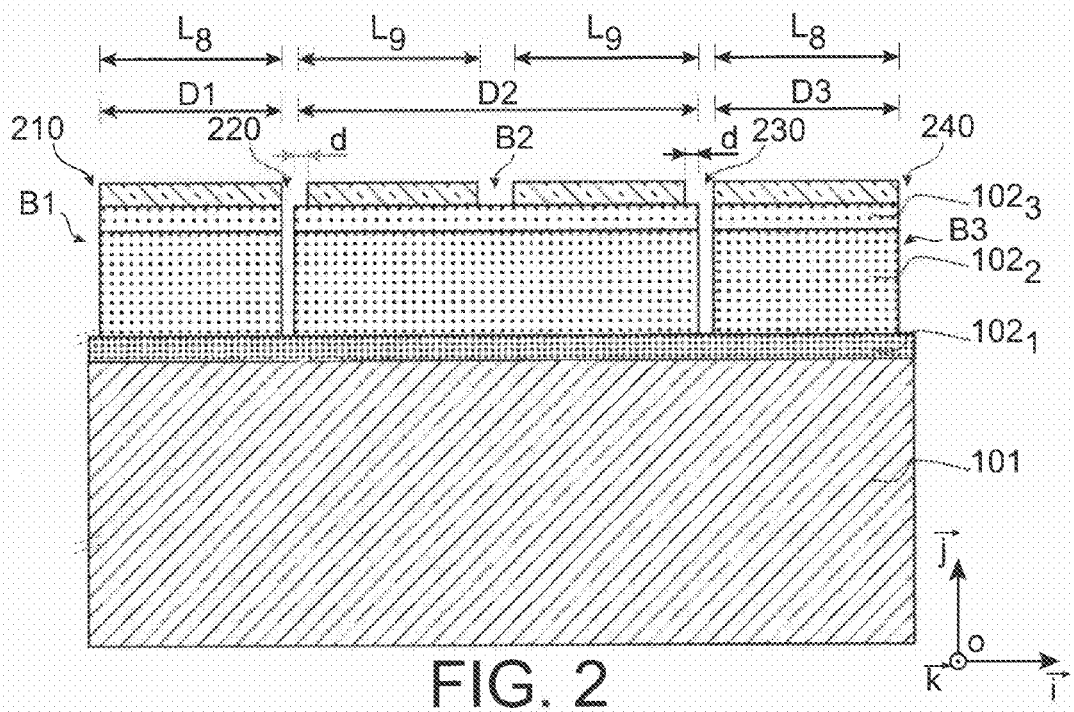
FIG. 2 illustrates an alternative embodiment of a method according to the invention.

On the device of FIG. 1C, a first trench 110 is formed in the continuation of a first side of the first semi-conductor zone $108_1$, a second trench 120 is for its part formed in the continuation of a second side of the first semi-conductor zone $108_1$, opposite to the first side. A first block $B_1$ covered with the first semi-conductor zone $108_1$ is thus formed in the layers of dielectric material $102_2$, $102_3$.

The critical dimension $L_8$ of the semi-conductor zones $108_1$, $108_2$ is provided at least less than the depth of the trenches 110, 120, 130, 140. A third trench 130 is formed in the continuation of a first side of the fourth semi-conductor zone $108_2$, a fourth trench 140 being formed in the continuation of a second side of the second semi-conductor zone $108_2$.

A second block $B_2$ covered with semi-conductor zones $109_1$, $109_2$ as well as a third block $B_3$ covered with the semi-conductor zone $108_2$ are thus formed in the layers of dielectric material $102_2$, $102_3$.

The first block $B_1$ and the third block $B_3$ have critical dimensions D1 and D3 equal or substantially equal to the critical dimension $L_8$ of the semi-conductor zones $108_1$ and $108_2$, and less than the depth of the trenches.

The second block $B_2$ may for its part be provided with a critical dimension greater than the depth of the trenches, for example a critical dimension D2 of around 300 nanometers. A dimension D2 of around double the thickness of the pre-strained layer makes it possible to obtain a good level of compression in the semi-conductor zones $109_1$, $109_2$.

The dimension D2 may for its part be provided at least greater than the depth of the trenches 110, 120, 130, 140.

A transfer onto the semi-conductor zones $108_1$, $108_2$, of the strain of the layer $102_2$ is carried out. An etching carried out in the entire thickness of the pre-strained layer $102_2$ enables a greater transfer of the strain state onto the zones $108_1$ and $108_2$.

On account of the choice of the critical dimension $L_8$ ($L_8$ chosen less than a predetermined limit length Lc) of the semi-conductor zones $108_1$ and $108_2$, and the layout of the trenches 110, 120, 130, 140 in relation to these semi-conductor zones $108_1$ and $108_2$, the type of strain exerted on these semi-conductor zones $108_1$ and $108_2$, is identical to that of the pre-strained layer $102_2$.

In other words, the deformation of the semi-conductor zones $108_1$ and $108_2$ is of same sign as that of the pre-strained layer $102_2$. For example, in one case where the strain of the pre-strained layer $102_2$ is a tensile strain, a tensile strain is also exerted on the semi-conductor zones $108_1$ and $108_2$.

When reference is made to a strain exerted on a semi-conductor zone $108_1$ or $108_2$, it is taken to mean an average strain resulting from all of the strains exerted on this semi-conductor zone $108_1$ or $108_2$.

Such a strain transfer onto the semi-conductor zones $108_1$ and $108_2$, is due to edge effects, which appear when the semi-conductor zones are formed with a sufficiently low critical dimension, chosen less than a predetermined limit length Lc. This limit length Lc is determined as a function in particular of the thickness of the semi-conductor layer 103 and the underlying layers in which the trenches are formed, in particular the thickness of the insulating layer $102_3$ and the pre-strained layer $102_2$.

The type of strain exerted on the semi-conductor zones $109_1$ and $109_2$ is different to that of the pre-strained layer $102_2$. In other words, the deformation of the semi-conductor zones $108_1$ and $108_2$ is of opposite sign to that of the pre-strained layer $102_2$. For example, in one case where the strain of the pre-strained layer $102_2$ is a tensile strain, a compressive strained is exerted on the semi-conductor zones $109_1$ and $109_2$.

When reference is made to a strain exerted on a semi-conductor zone $109_1$ or $109_2$, it means an average strain resulting from all of the strains exerted on this semi-conductor zone $109_1$ or $109_2$.

Thus, a different strain transfer is exerted on the semi-conductor zones $109_1$ and $109_2$.

Thus, the trenches 110, 120, 130, 140 make it possible to relax the strain of the second layer of dielectric material $102_2$ at the blocks $B_1$-$B_3$, and to transfer this tensile strain to the summit of the blocks $B_1$ and $B_3$, in other words to the semi-conductor zones $108_1$, $108_2$.

In this example, with a tensile pre-strained layer $102_2$, the semi-conductor zones $108_1$ and $108_2$ undergo a tensile strain, whereas the semi-conductor zones $109_1$ and $109_2$ undergo for their part a compressive strain.

The first semi-conductor zone $108_1$ may be tensile strained and undergo a strain for example of around one hundred or so MPa. The semi-conductor zone $109_1$ may be compressive strained and undergo a strain for example of around several hundreds of MPa.

A space of at least one predetermined value d, may if necessary be provided between the mouth of the trenches 120, 130, and the semi-conductor zones $109_1$, $109_2$, in order to avoid the aforementioned edge effects on the semi-conductor zones $109_1$, $109_2$. In this example, the semi-conductor zones $109_1$ and $109_2$ having a critical dimension $L_9$ chosen greater than Lc, this space d may be optional and may be low or zero.

The depth of the trenches 110, 120, 130, 140 may be provided and modulated as a function of the level of strain that it is wished to confer on the semi-conductor zones $108_1$, $108_2$, $109_1$, $109_2$.

The trenches 110, 120, 130, 140 may then be filled, for example by means of an insulating material 145. The insulating material 145 for filling the trenches may if necessary itself have a strain state.

Then, on each of the semi-conductor zones $108_1$, $108_2$, $109_1$, $109_2$, may be formed a gate dielectric zone 160, and a gate 162 on the dielectric zone 160.

Spacers 163, 164 on the sides of the gate 160 may then be formed.

Then, one or several steps of doping by diffusion and/or implantation may be carried out in order to complete the formation of source 171 and drain 172 zones.

Figure 3:
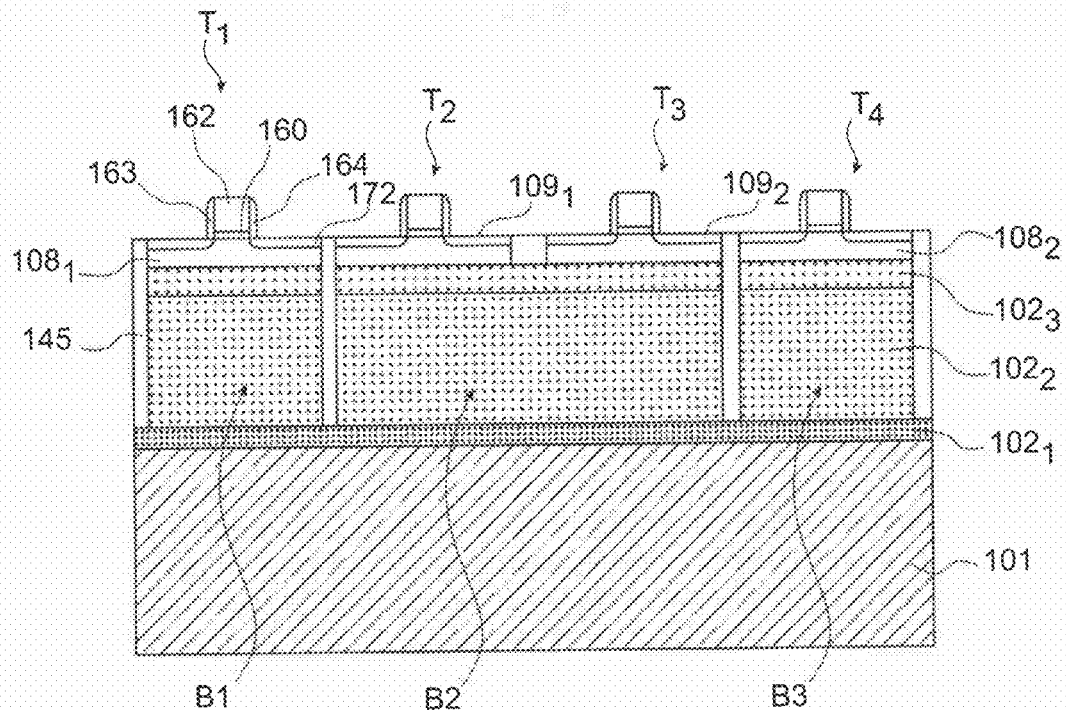
FIGS. 3 to 5 illustrate examples of microelectronic devices obtained by means of a method according to the invention.

A device comprising transistors $T_1$ and $T_4$ provided with channel zones formed respectively of tensile strained semi-conductor zones $108_1$, $108_2$, has thus been formed and transistors $T_2$ and $T_3$, comprising channel zones respectively of compressive strained semi-conductor zones $109_1$, $109_2$, has thus been formed (FIG. 3).

The strain state of each of the semi-conductor zones $108_1$, $108_2$, $109_1$, $109_2$, obtained after the different steps described above, may be estimated by means of numerical calculations performed with a simulation tool, for example such as the ANSYS-v10 tool of the ANSYS Company.

Figure 6A:
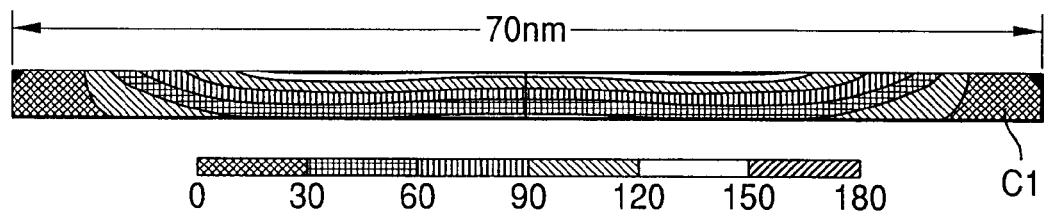
FIGS. 6A to 6B and 7 show results of simulations in the form of strain fields exerted on the semi-conductor zones of devices according to the invention, FIGS. 8A-8D give examples of evolution curves of the average strain exerted on a semi-conductor zone obtained by means of a method according to the invention, as a function of its critical dimension, for different values of thickness of this zone and a stack of layers underlying this zone and comprising at least one pre-strained layer, FIGS. 9A-9B give respectively an example of structure and an example of equivalent structure, used for the determination of a limit length Lc, compared to which the critical dimension of the semi-conductor zones of a microelectronic device implemented according to the invention is provided.
Figure 6B:
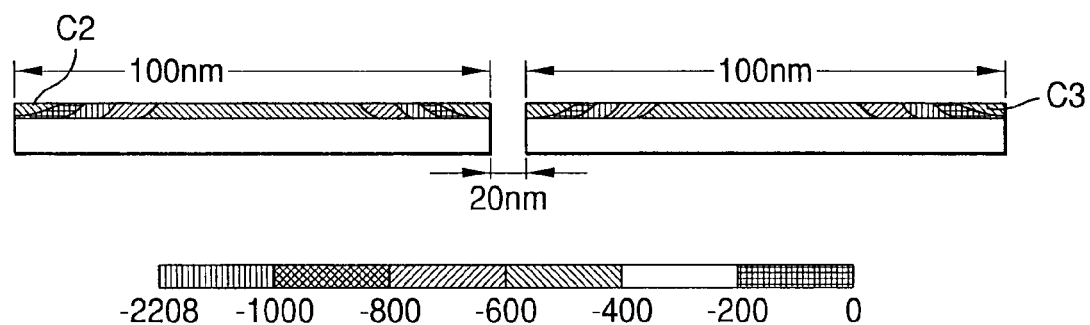

In FIGS. 6A and 6B field strains along the axis [O; $\vec{i}$) of the direction of transport, are given. FIG. 6A shows, by means of the strain field C1, that in a given thickness of their upper face, for example around 3 to 4 nanometers, the semi-conductor zones $108_1$, $108_2$ have an overall average positive strain and are thus tensile strained.

In FIG. 6B, the strain fields $C_2$ and $C_3$, show that in a given thickness of their upper face, for example around 3 to 4 nanometers, the semi-conductor zones $109_1$, $109_2$ have an overall average negative strain and are thus compressive strained.

According to an alternative (FIG. 2) of carrying out the method, vertical trenches 210, 220, 230, 240 are formed, orthogonal to the principal plane of the substrate of the pre-strained layer $102_2$, extending through the third layer of dielectric material $102_3$ as well as the entire thickness of the pre-strained layer $102_2$, so as to reveal the first layer of dielectric material $102_1$. This makes it possible to obtain a higher strain state on the semi-conductor zones.

According to another possible embodiment, the semi-conductor layer 103 resting on the insulating layer 102 may also be a pre-strained layer, in other words having an intrinsic strain. The semi-conductor layer 103 may for example have a biaxial strain in a plane perpendicular to the principal plane of the substrate. The pre-deformation of the semi-conductor layer 103 may in this case have been obtained for example by heteroepitaxy or by molecular bonding.

Two examples of methods, to define the limit length Lc, will now be given. A combination of the 2 methods may if necessary be used.

In FIGS. 8A-8D, different results of simulations are illustrated, and are representative of the average strain state $\sigma_{moy}$ over one thickness of around 3 nm of one semi-conductor zone 508 having a layout similar to that of the zone $108_1$ of the device described previously with reference to FIG. 2.

Figure 9A:
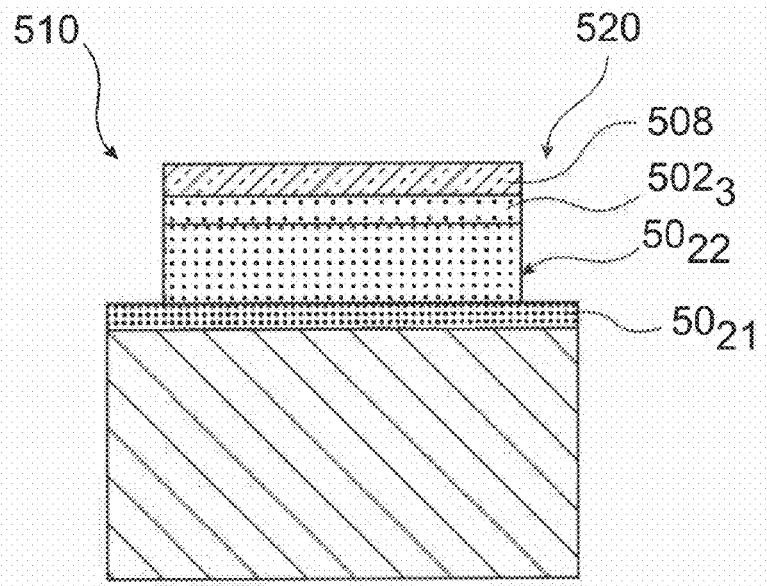

The semi-conductor zone 508 rests on an insulating zone 502, for example based on $SiO_2$, itself resting on a pre-strained zone $502_2$, for example based on $Si_3N_4$, itself resting on an insulating layer $502_1$, for example based on $SiO_2$. This semi-conductor zone 508 is intended to contain the channel of a transistor and corresponds to the region in which a charge transport takes place. Trenches 510, 520 are formed on either side of the zones 508, $502_3$, $502_2$, up to the insulating layer 502, (FIG. 9A).

Simulations have been performed with the ANSYS tool for several dimensions $L_{ZA}$ of the semi-conductor zone 508, and for different thicknesses $e_{si}$ of this semi-conductor zone 508, and different thicknesses and $e_{SiO2}$ of the insulating layer $502_3$ based on $SiO_2$. For these simulations, the thickness of the pre-strained layer $502_2$ has, for its part, been fixed. This thickness is provided large compared to the thicknesses of the semi-conductor zone 508 and the zone $502_1$, for a pre-strained layer $502_2$ based on nitride, of thickness fixed at 200 nm.

Figure 8A:
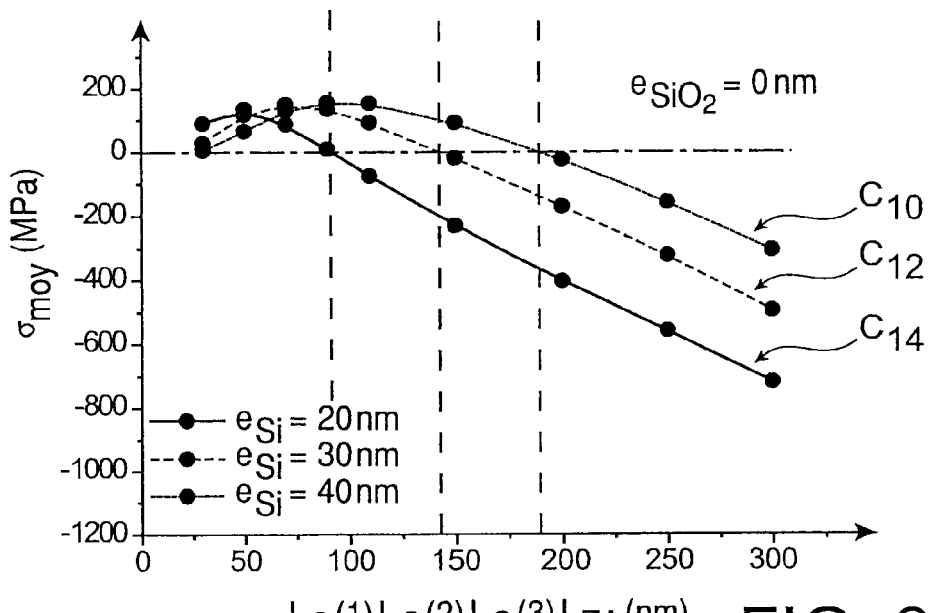

In FIG. 8A, the curves $C_{10}$, $C_{12}$, $C_{14}$ represent an average strain state $\sigma_{moy}$ of the semi-conductor zone 508 as a function of its length $L_{ZA}$, with $e_{SiO2}=0$ nm respectively, for $e_{Si}=20$ nm, $e_{Si}=30$ nm, $e_{Si}=40$ nm.

Figure 8B:
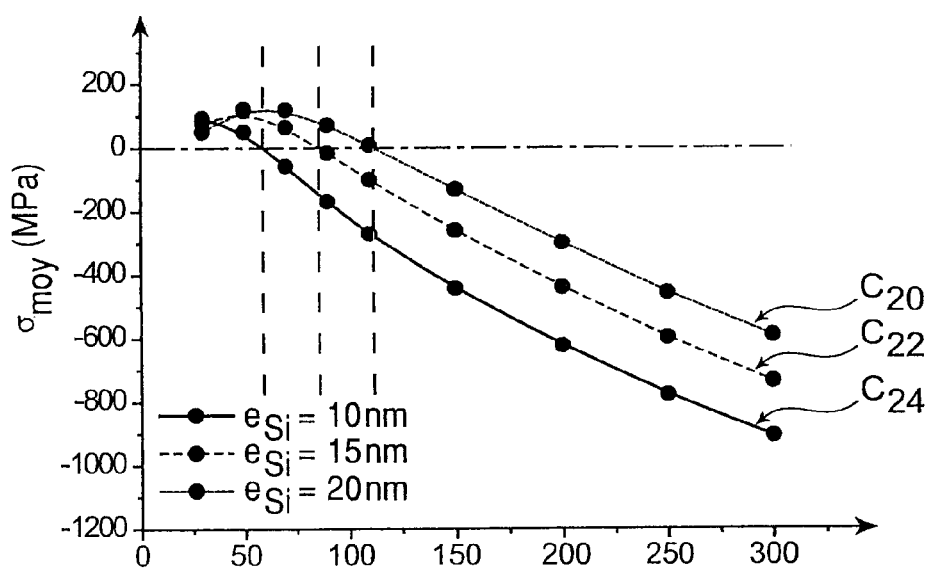

In FIG. 8B, the curves $C_{20}$, $C_{22}$, $C_{24}$ represent an average strain state $\sigma_{moy}$ of a semi-conductor pattern as a function of its length $L_{ZA}$, with $e_{SiO2}=5$ nm respectively, for $e_{Si}=10$ nm, $e_{Si}=15$ nm, and $e_{Si}=20$ nm.

Figure 8C:
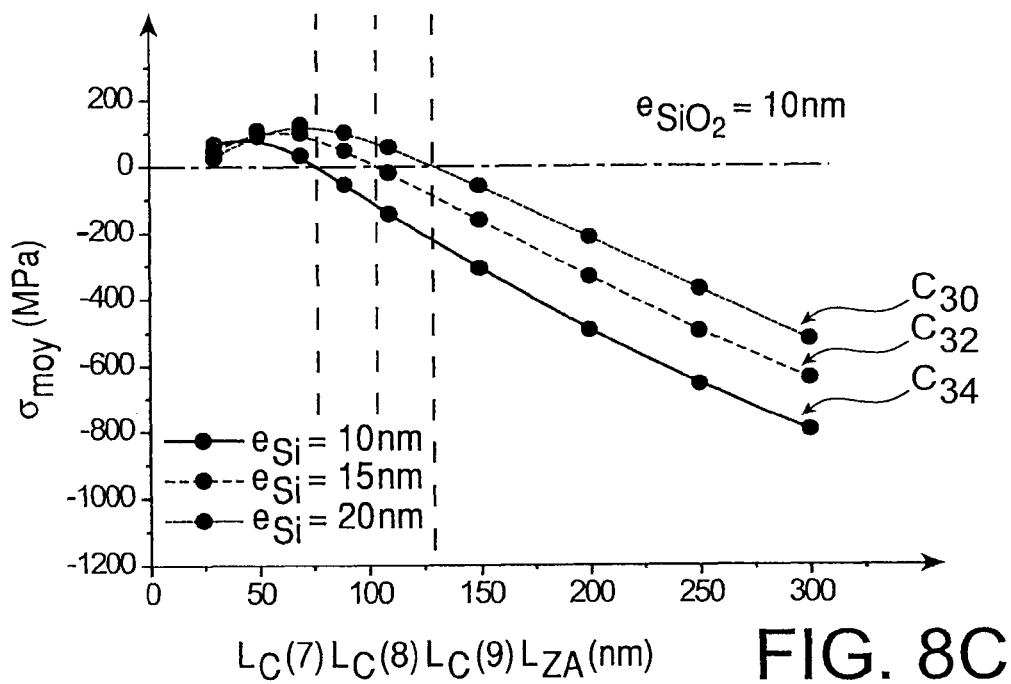
Figure 8D:
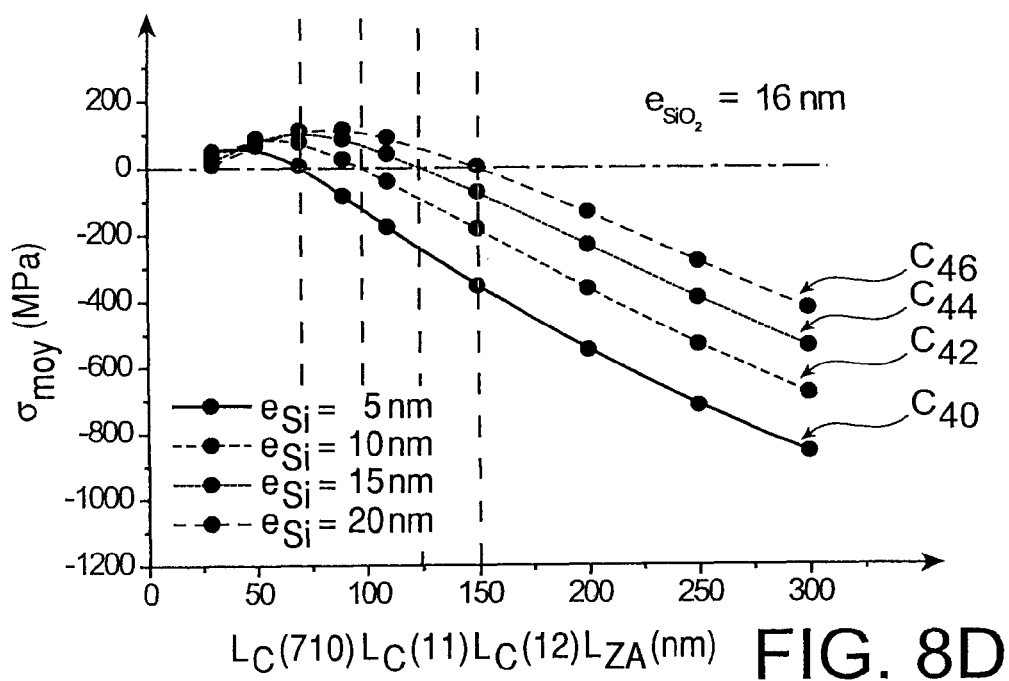

In FIG. 8C, the curves $C_{30}$, $C_{32}$, $C_{34}$ represent an average strain state $\sigma_{moy}$ of a semi-conductor pattern as a function of its length $L_{ZA}$, with $e_{SiO2}=10$ nm, respectively, for $e_{Si}=10$ nm, $e_{Si}=15$ nm, and $e_{Si}=20$ nm.

In FIG. 8A, the curves $C_{40}$, $C_{42}$, $C_{44}$, $C_{46}$ represent an average strain state $\sigma_{moy}$ of a semi-conductor pattern as a function of its length $L_{ZA}$, with $e_{SiO2}=16$ nm respectively, for $e_{Si}=5$ nm, $e_{Si}=10$ nm, $e_{Si}=15$ nm, and $e_{Si}=20$ nm.

In all of these figures, the limit length Lc corresponds to the limit value for which the average strain $\sigma_{moy}$ of the semi-conductor zone 508 changes sign and goes from tensile to compressive.

The limit values obtained for different thicknesses noted Lc( ) are represented by means of broken vertical lines in FIGS. 8A to 8D.

A first method thus consists in providing the thickness and the composition of the layers $502_3$, $502_2$, $502_3$ and to use such simulations to determine Lc. For a given thickness of the layer $502_2$, this critical length Lc increases with the thickness of the semi-conductor zone 508. Similarly for a given thickness of this zone 508, the limit length Lc increases with the thickness of the insulating layer $502_3$.

According to a second method, an empirical relation is used to established between the limit length Lc, and the different dimensions of the structure such that the thickness of the pre-strained layer $502_2$, of the insulating layer $502_3$, by means of an analytical model such as that of document [1]: Hu et al., Appl. Phys., 50(7), p. 4661, July 1979, and the document [2]: Hu et al., Appl. Phys., 70(6), p. R53, September 1991 may be used.

This relation may be established by using if necessary an approximation according to which a semi-conductor zone 508 of low thickness compared to that of the substrate is considered, the strain $\sigma_0$ of which is uniform in the principal plane of this zone and zero in the direction of its thickness.

A relation between the ratio of the average strain $\sigma_{moy}$ and the strain $\sigma_0$: ($\sigma_{moy}/\sigma_0$), and between the reduced parameter (KL/h) may be used.

$$\text{With: } K = \frac{E_{substrat}(1 - v_{film}^2)}{E_{film}(1 - v_{substrat}^2)};$$

Figure 9B:
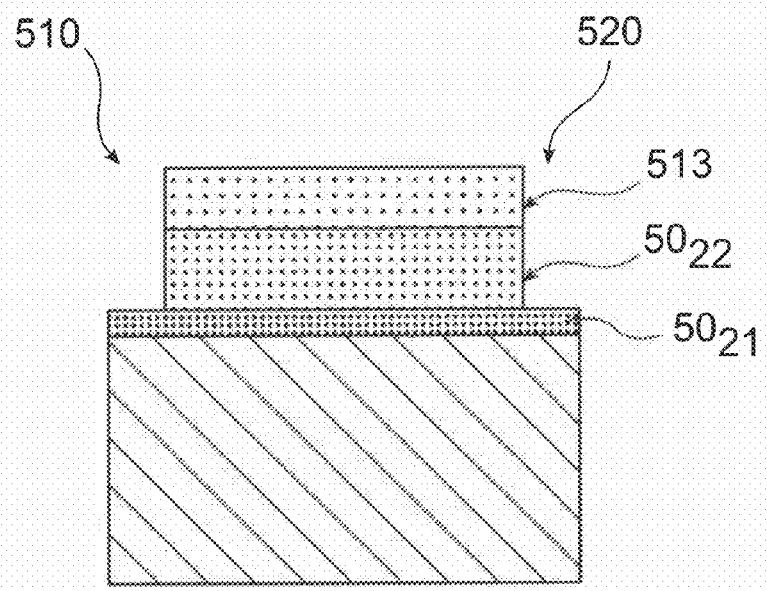

Efilm: the Young's modulus of the semi-conductor zone 508;

Esubstrate: the Young's modulus of the substrate;

vfilm: the Poisson's coefficient of the semi-conductor zone 508;

vfilm: the Poisson's coefficient of the substrate;

In order to come down to a similar case to that of the model described in documents [1] and [2], another approximation may be used in which the double layer formed by the insulating layer $502_3$ and the semi-conductor zone 508 based on Si is replaced by a single layer 513 of $SiO_2$ of equivalent thickness $e_{eq}$, so that: $e_{eq}=e_{SiO2}+e_{Si=SiO2}$, with $e_{Si=SiO2}$ represents the equivalent thickness from a mechanical point of view of $SiO_2$ of the layer of semi-conductor zone 508 (FIG. 9B).

The flexural stiffness of these two layers (($e_{Si=SiO2}$) and ($e_{Si}$)) is preferably constant.

The following relation is obtained:

$$\frac{I_{Si=SiO2} \cdot E_{SiO2}}{1 - v_{SiO2}^2} = \frac{I_{Si} \cdot E_{Si}}{1 - v_{Si}^2} \Rightarrow e_{Si=SiO2} = \left(\frac{E_{Si}(1 - v_{SiO2}^2)}{E_{SiO2}(1 - v_{Si}^2)}\right)^{1/3} \cdot e_{Si}$$

Where $I_i$ represents the moment of inertia of the layer i.

Figure 10:
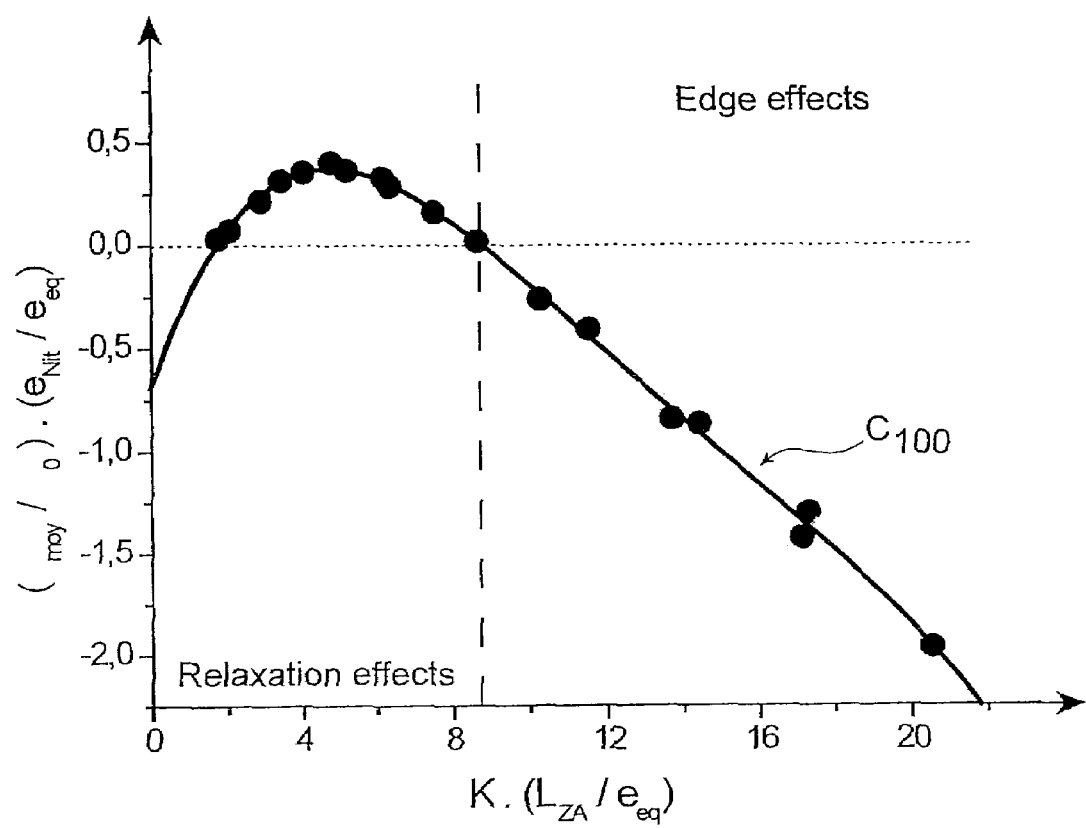
FIG. 10 illustrates an inversion of the type of strain, from tensile to compressive, exerted on a semi-conductor zone obtained by means of a method according to the invention, as a function of the critical dimension chosen for this semi-conductor zone.

In FIG. 10, an example of evolution curve $C_{100}$ of the ratio $(\sigma_{moy}/\sigma_0)*(e_{nit}/e_{eq})$ as a function of $(K.L_{ZA}/e_{eq})$ is given, where:

$$K = \frac{E_{Nit}(1-v_{SiO2}^2)}{E_{SiO2}(1-v_{Nit}^2)},$$

$e_{nit}$ the thickness of the pre-strained layer $502_2$

The results represented by this curve $C_{100}$ concern two embodiments: a first wherein the thickness $e_{SiO2}$ is around 16 nm with a thickness $e_{Si}$ of around 15 nanometers and a second embodiment wherein a thickness of oxide $e_{SiO2}$ is around 16 nm with a thickness of silicon $e_{Si}$ around 20 nm.

In both cases, the evolution of the average strain as a function of the reduced parameter ($K.L_{ZA}/e_{eq}$) is almost identical and represented by the curve $C_{100}$ in FIG. 10, and may be brought closer by a 5 order polynomial adjustment.

This curve $C_{100}$ cancels itself out for a value of:

$$\left(K \cdot \frac{L_{ZA}}{e_{eq}}\right)_c \approx 8.77$$

A value of $L_c$ may thus be obtained corresponding to the point at which the curve cancels itself out, for any thickness of the insulating layer $502_3$ and the semi-conductor zone 508.

A combination of the 2 aforementioned methods may if necessary be used. Limit length values $L_c$ may be extracted for different pairs ($e_{SiO2}$; $e_{Si}$), by extrapolating the curves as illustrated in FIGS. 8A-8B, then these values may be compared with those calculated by means of the empirical formula given above.

The results of this comparison are given for example in the following table.

| ($e_{sio2}$; $e_{si}$) (nm) | $(L_{za})_c$ (nm) | $(L_{za})_c$ calculated (nm) |
|---|---|---|
| (0; 40) | 192 | 189 |
| (0; 20) | 95 | 92 |
| (5; 20) | 113 | 112 |
| (5; 10) | 65 | 60 |
| (10; 20) | 131 | 131 |
| (10; 10) | 83 | 79 |
| (16; 10) | 104 | 100 |

The limit length values $L_c$ obtained by the aforementioned two examples of methods are very close to each other.

Figure 4:
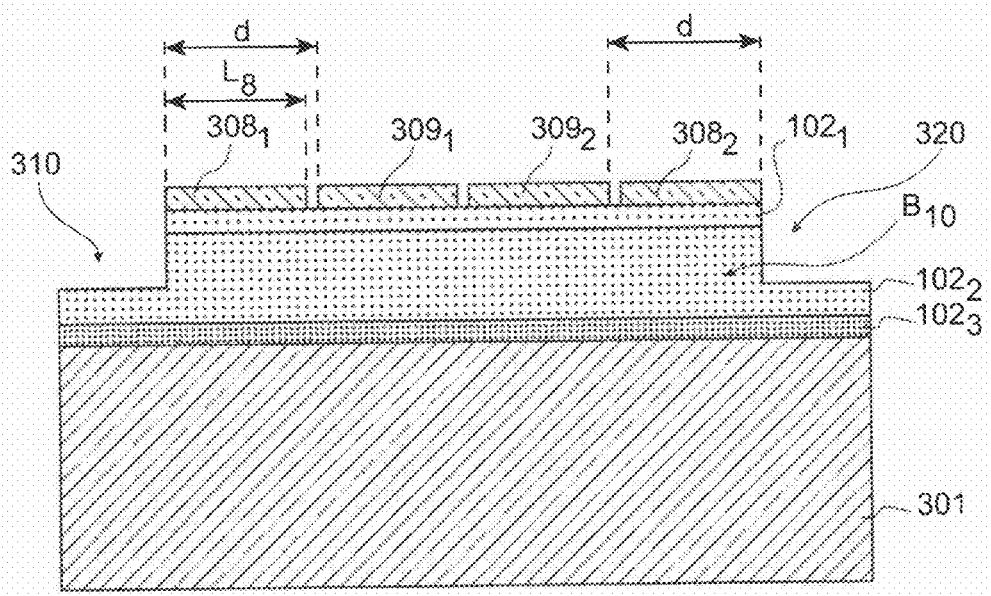

FIG. 4 illustrates an alternative of the example of microelectronic device described previously with reference to FIG. 2. In this example, the device comprises semi-conductor zones $308_1$, $308_2$, $309_1$, $309_2$, intended to form active zones spread out on a same insulating block $B_{10}$.

A first semi-conductor zone $308_1$, and a second semi-conductor zone $308_2$, have a critical dimension $L_8$ provided less than the predetermined limit length Lc/2, the determination methods of which have been given above, and which is determined as a function in particular of the thickness of the semi-conductor zones of the layers $102_3$ and $102_2$.

A third semi-conductor zone $309_1$, and a fourth semi-conductor zone $309_2$, have a critical dimension that may also be less than or equal to the predetermined limit length Lc.

The semi-conductor zones $308_1$, $309_1$, $308_2$, $309_2$, are strained and rest on an etched block $B_{10}$ formed in a stack of thin films comprising a pre-strained layer $102_2$. Trenches 310, 320, are formed in a part of the thickness of the pre-strained layer $102_2$, on either side of the etched block $B_{10}$. The trenches 310, 320, have a depth greater than the critical dimension $L_8$ of the semi-conductor zones $308_1$ and $308_2$. A trench 320 is formed in the continuation of one side of the semi-conductor zone $308_2$. Another trench 310 is for its part formed in the continuation of one side of the semi-conductor zone $308_1$. A transfer of the strain from the pre-strained layer $102_2$ to the summit of the block $B_{10}$ is implemented in the semi-conductor zones $308_1$ and $308_2$.

In one case for example where the pre-strained layer $102_2$ is tensile strained, the semi-conductor zones $308_1$ and $308_2$ are also tensile strained.

A semi-conductor zone $309_2$ juxtaposed with the semi-conductor zone $308_2$, is for its part situated at a distance d of at least Lc/2 of the trench 320.

With such a layout, in one case for example where the pre-strained layer $102_2$ is tensile strained, the semi-conductor zones $109_1$ and $109_2$ are compressive strained or have an average strain corresponding to a compressive strain.

Figure 5:
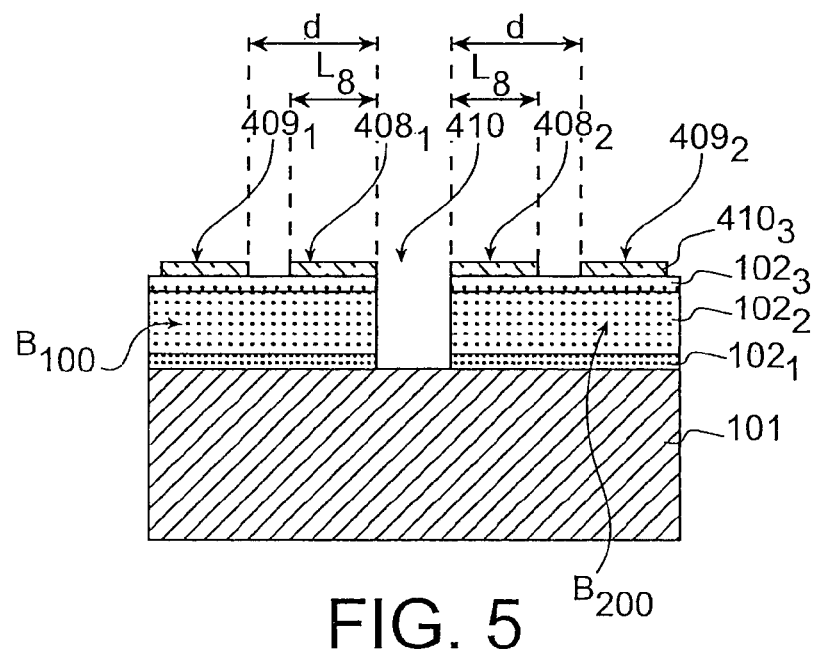

In FIG. 5, another example of microelectronic device obtained by means of a method according to the invention is given.

The device comprises semi-conductor zones $408_1$, $408_2$ strained according to a first type of strain, for example a tensile strain, and semi-conductor zones $409_1$, $409_2$ strained according to a second type of strain, for example a compressive strain.

The semi-conductor zones $408_1$, $409_1$, may have been formed from a pre-strained semi-conductor layer, and rest on a first block $B_{100}$ formed of a stack of layers of dielectric material $102_1$, $102_2$, $102_3$, of which at least one pre-strained layer $102_2$, for example tensile pre-strained.

The semi-conductor zones $408_2$, $409_2$ may have been formed from said pre-strained semi-conductor layer, and rest on a second block $B_{200}$ formed in the stack of layers of dielectric material $102_1$, $102_2$, $102_3$.

The semi-conductor zones $408_1$, $408_2$ are provided with a critical dimension $L_8<Lc/2$, with Lc the limit length, the determination methods of which have been given above, and which is a function of the thickness of the semi-conductor zones as well as the respective thickness of the layers $102_2$ and $102_3$.

A trench 410 separates the first block $B_{100}$ from the second block $B_{200}$. This trench is formed in the continuation of one side of the semi-conductor zone $408_1$ and one side of the semi-conductor zone $408_2$. The semi-conductor zones $409_1$ and $409_2$ are for their part situated at a distance d of at least Lc/2 of the trench 410, in order to make it possible to confer on these semi-conductor zones $409_1$ and $409_2$, a strain of opposite sign to that of the strain of the pre-strained layer and the strain of the semi-conductor zones $408_1$, $408_2$.

Figure 7:
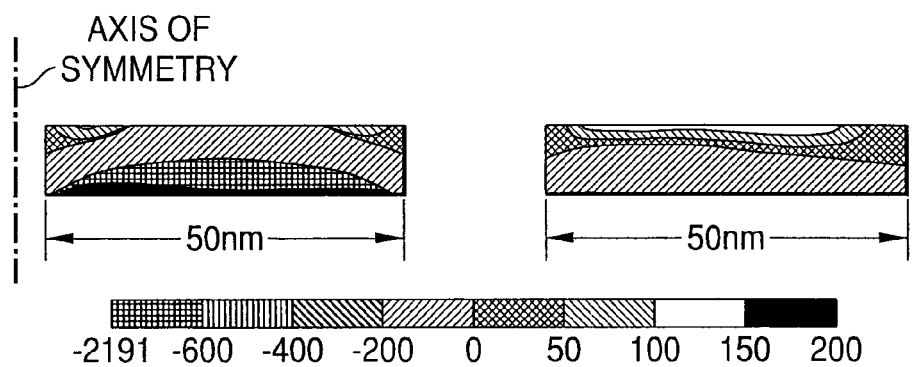

In FIG. 7, strain fields along the axis [O; $\vec{i}$) of the direction of transport, are given. This figure shows, by means of the strain field C3, that the semi-conductor zone $408_2$ is tensile strained, whereas the strain field C4 shows that the semi-conductor zone $409_2$ is compressive strained.

The invention claimed is:

1. A method of forming a microelectronic device including, on a same support, at least one tensile strained semi-conductor zone, and at least one compressive strained semi-conductor zone, the method comprising:
   forming from a stack of layers resting on a substrate and comprising at least one semi-conductor layer situated above at least one pre-strained layer, at least one first semi-conductor zone having a first critical dimension $L_8$ provided less than a predetermined length Lc, and at least one second semi-conductor zone having a second critical dimension $L_9$ provided greater than said predetermined length Lc; and forming one or several trenches in at least a part of a thickness of said pre-strained layer, at least one first trench among said one or several trenches being situated in a continuation of at least one first side of said at least one first semi-conductor zone, the predetermined length Lc having been determined as a function of a thickness of the layers of the stack in which the one or several trenches are formed, and so that the at least one first semi-conductor zone has, following the forming the one or several trenches, a same strain as said pre-strained layer, and said at least one second semi-conductor zone having an opposite strain to that of said pre-strained layer.

2. The method according to claim 1, among said one or several trenches at least one other trench being formed in a continuation of a second side of said at least one first semi-conductor zone, opposite to said first side.

3. The method according to claim 1, wherein the at least one second semi-conductor zone rests on a block etched during said forming the one or several trenches, and said forming the one or several trenches includes forming at least two trenches situated on either side of said etched block.

4. The method according to claim 3, wherein said etched block has a critical dimension greater than a depth of said at least two trenches.

5. The method according to claim 1, wherein said forming the one or several trenches includes forming the one or several trenches in a part of the thickness of the pre-strained layer or in an entire thickness of the pre-strained layer.

6. The method according to claim 1, wherein said pre-strained layer is based on a dielectric material.

7. The method according to claim 1, wherein said stack comprises an adhesion layer between the pre-strained layer and the semi-conductor layer.

8. The method according to claim 1, wherein said pre-strained layer is situated on a layer of dielectric material resting on a semi-conductor support layer.

9. The method according to claim 1, further comprising:
filling the one or several trenches with an insulating material.

10. The method according to claim 1, further comprising:
forming on one or several or on all of said semi-conductor zones at least one gate dielectric zone and at least one gate on the gate dielectric zone.

11. The method according to claim 1, wherein the pre-strained layer is tensile strained, the at least one first semi-conductor zone is tensile strained, and the at least one second semi-conductor zone is compressive strained.

12. The method according to claim 1, wherein a depth of the one or several trenches is equal to half of the critical dimension $L_8$ of said at leas one first semi-conductor zone.

13. A method of forming a microelectronic device including, on a same support, at least one tensile strained semi-conductor zone, and at least one compressive strained semi-conductor zone, the method comprising:

forming from a stack of layers resting on a substrate and comprising at least one semi-conductor layer situated above at least one pre-strained layer, at least one first semi-conductor zone having a first critical dimension $L_8$ provided less than a predetermined length Lc, and at least one second semi-conductor zone; and forming one or several trenches in at least a part of a thickness of said pre-strained layer, at least one first trench among said one or several trenches being situated in a continuation of at least one first side of said at least one first semi-conductor zone, a space d, such that d >Lc/2 is provided between said at least one second semi-conductor zone and said one or several trenches, the predetermined length Lc having been determined as a function of a thickness of the layers of the stack in which the one or several trenches are formed, and so that the at least one first semi-conductor zone has, following the forming of the one or several trenches, a same strain as said pre-strained layer, and said at least one second semi-conductor zone having an opposite strain to that of said pre-strained layer.

14. The method according to claim 13, wherein said at least one second semi-conductor zone has a critical dimension $L_9$ less than or equal to the first critical dimension $L_8$.

15. The method according to claim 13, among said one or several trenches at least one other trench being formed in a continuation of a second side of said at least one first semi-conductor zone, opposite to said first side.

16. The method according to claim 13, wherein the at least one second semi-conductor zone rests on a block etched during said forming the one or several trenches, and said forming the one or several trenches includes forming at least two trenches situated on either side of said etched block.

17. The method according to claim 16, wherein said etched block has a critical dimension greater than a depth of said at least two trenches.

18. The method according to claim 13, wherein said forming the one or several trenches includes forming the one or several trenches in a part of the thickness of the pre-strained layer or in an entire thickness of the pre-strained layer.

19. The method according to claim 13, wherein said pre-strained layer is based on a dielectric material.

20. The method according to claim 13, wherein said stack comprises an adhesion layer between the pre-strained layer and the semi-conductor layer.

21. The method according to claim 20, wherein said pre-strained layer is situated on a layer of dielectric material resting on a semi-conductor support layer.

22. The method according to claim 13 further comprising:
filling the one or several trenches with an insulating material.

23. The method according to claim 13, further comprising:
forming on one or several or on all of said semi-conductor zones at least one gate dielectric zone and at least one gate on the gate dielectric zone.

24. The method according to claim 13, wherein the pre-strained layer is tensile strained, the at least one first semi-conductor zone is tensile strained, and the at least one second semi-conductor zone is compressive strained.

25. The method according to claim 24, wherein a depth of the one or several trenches is equal to half of the critical dimension $L_8$ of said at least one first semi-conductor zone.

* * * * *